United States Patent
Bao et al.

(10) Patent No.: US 7,370,249 B2
(45) Date of Patent: May 6, 2008

(54) METHOD AND APPARATUS FOR TESTING A MEMORY ARRAY

(75) Inventors: Zhuoyu Bao, Austin, TX (US); David M. Wu, Austin, TX (US); Chih-Jen M. Lin, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 10/874,718

(22) Filed: Jun. 22, 2004

(65) Prior Publication Data

US 2005/0283688 A1    Dec. 22, 2005

(51) Int. Cl.
*G11C 29/00*    (2006.01)

(52) U.S. Cl. .................. 714/718; 714/733; 714/734; 714/719; 714/742; 714/30; 714/42; 714/54; 365/201

(58) Field of Classification Search ............ None
See application file for complete search history.

(56) References Cited

U.S. PATENT DOCUMENTS

| | | | |
|---|---|---|---|
| 5,311,520 A * | 5/1994 | Raghavachari ............. 714/723 |
| 5,640,509 A * | 6/1997 | Balmer et al. ............... 714/42 |
| 5,828,825 A * | 10/1998 | Eskandari et al. ........... 714/27 |
| 6,370,661 B1 * | 4/2002 | Miner ......................... 714/718 |
| 6,421,794 B1 * | 7/2002 | Chen et al. ................... 714/42 |
| 6,553,525 B1 * | 4/2003 | Shephard, III .............. 714/733 |
| 6,646,935 B2 * | 11/2003 | Akioka ....................... 365/201 |
| 6,829,740 B2 * | 12/2004 | Rajski et al. ............... 714/729 |
| 6,993,696 B1 * | 1/2006 | Tanizaki et al. ............ 714/744 |
| 7,171,596 B2 * | 1/2007 | Boehler ...................... 714/718 |
| 2002/0194545 A1 * | 12/2002 | Abbott ......................... 714/42 |
| 2003/0120974 A1 * | 6/2003 | Adams .......................... 714/31 |
| 2003/0167431 A1 * | 9/2003 | Nicolaidis et al. .......... 714/733 |
| 2004/0123200 A1 * | 6/2004 | Caty et al. .................. 714/733 |

* cited by examiner

*Primary Examiner*—John P Trimmings
(74) *Attorney, Agent, or Firm*—Trop, Pruner & Hu, P.C.

(57) ABSTRACT

A technique for testing a memory array. More particularly, embodiments of the invention relate to a memory array testing architecture in which a memory array within a device under test (DUT) is able to be tested at speeds substantially similar to those under typical operating conditions of the memory array without incurring significant die real estate and power penalties.

26 Claims, 8 Drawing Sheets

PROGRAM SEQUENCE

∧(WD1)∧(RD2, WI3)∧(RI4, WD5)v(RD6, WI7)v(RI8, WD9)v(RD10)

'∧' = INCREMENT ADDRESS

'v' = DECREMENT ADDRESS

'W' = PROGRAM DATA

'R' = READ DATA

METHOD AND APPARATUS FOR TESTING A MEMORY ARRAY

FIELD

Embodiments of the invention relate to semiconductor memory testing. More particularly, embodiments of the invention are related to techniques to enhance memory testing performance using testing equipment that may run slower than processing circuitry within the device under test.

BACKGROUND

Testing of memory arrays, whether embedded within a processor die or external to the processor die, typically requires command, control, and test data to be generated by testing equipment or extensive logic within, or associated with, the device under test (DUT). Commands (e.g., read, write, etc.) typically involve operations to be executed by some state machine or processor within the DUT in order to interact with the memory array. Control typically involves memory addresses or other signals that place the memory array or interfacing logic in a particular state in order to interact with the memory array. Data usually refers to the actual information (normally in bit format) programmed into or read from the memory array.

In order to test the DUT at speeds similar to those under normal operating conditions, testing equipment typically must operate beyond its capability. As a result, the array may not be tested under normal operating conditions, which may result in defects within the array going undetected. In the case in which extensive logic is used within, or at least associated with, the DUT to generate testing command, control, and data, processor power and/or real estate budgets may be compromised in order to accommodate the testing logic.

Figure 1:
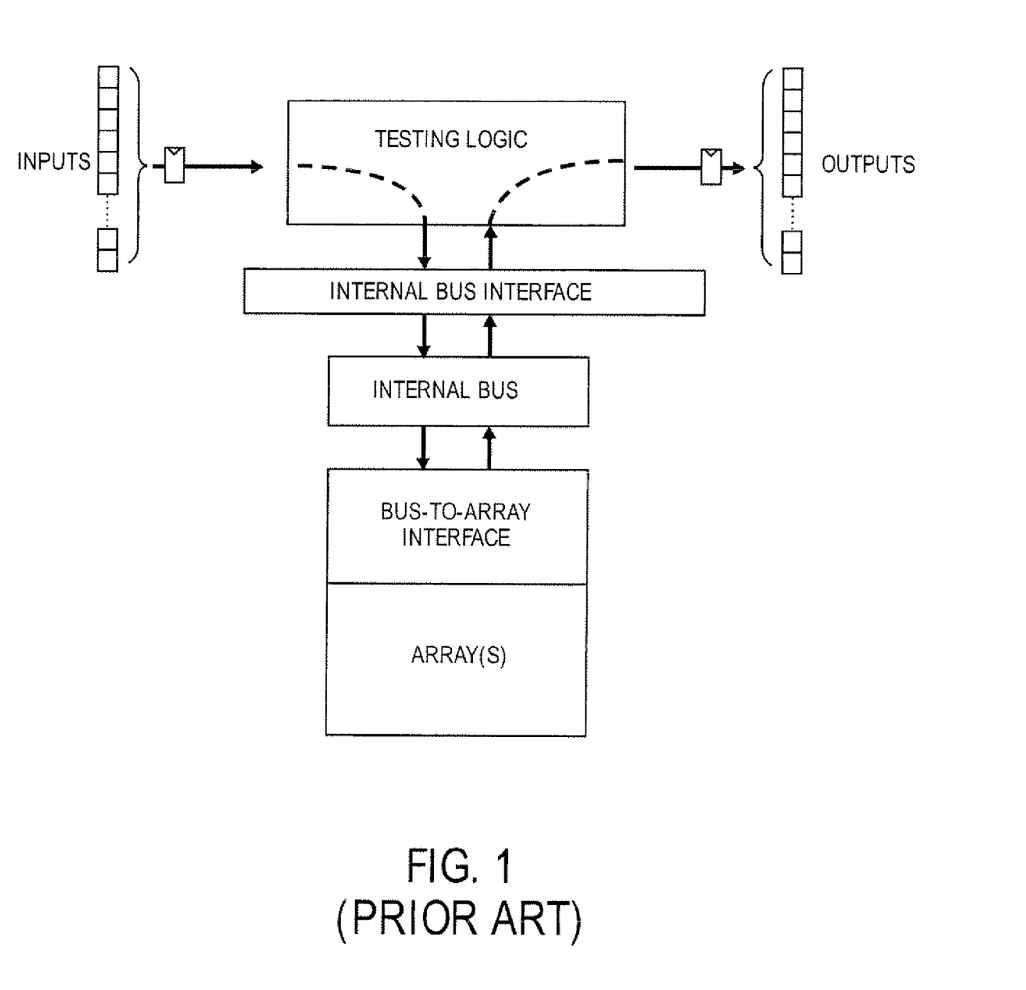
FIG. 1 illustrates a prior art memory array testing architecture in which testing equipment generates control, command, and data necessary to test a memory array within a device under test (DUT).

FIG. 1 illustrates a prior art memory array testing architecture in which algorithmic pattern generation (APG) logic within the testing equipment is used to generate command, control, and data necessary to test the DUT. In FIG. 1, control, command, and data generated by the testing equipment may be input to the DUT on parallel inputs and translated into a format compatible with the internal bus interface. The translated control, commands, and data may then be transmitted across the internal bus of the DUT where it is further translated within the bus-to-array interface into the test pattern to be applied to the memory array.

In the prior example illustrated in FIG. 1, APG logic within the testing equipment is used to generate the command, control, and data necessary to test the memory array within the OUT. Because memory testing equipment is not typically able to test memory arrays at the speeds at which they are accessed (read or programmed) under normal operating conditions, the testing architecture of FIG. 1 can be deficient in its test coverage.

Figure 2:
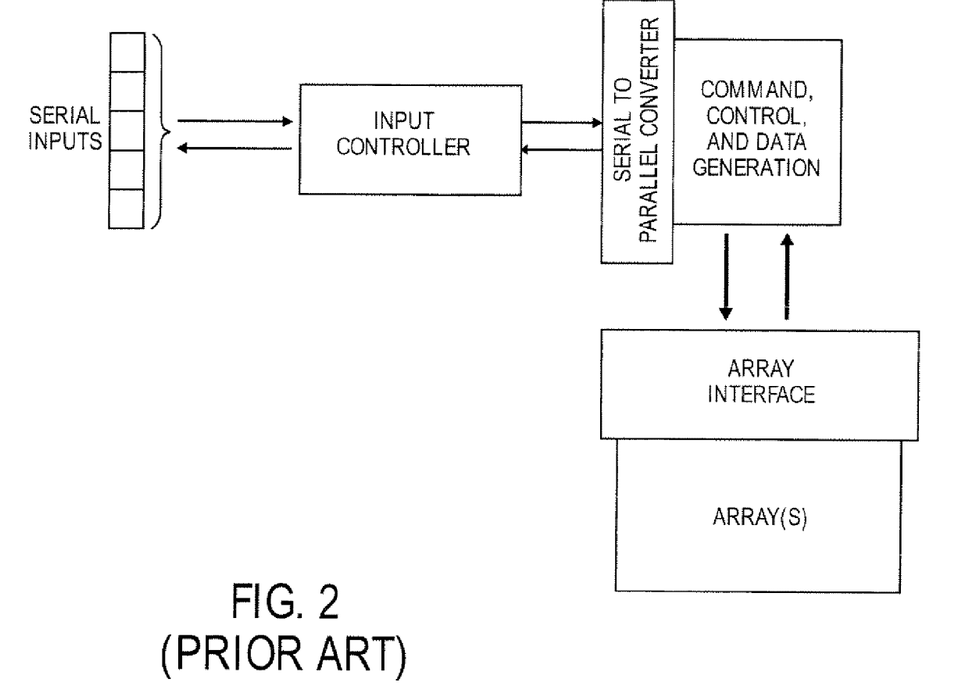
FIG. 2 illustrates a prior art memory array testing architecture in which logic within the DUT is used to generate the control, command, and data necessary to test a memory array with a DUT.

FIG. 2 illustrates a prior art testing architecture in which a controller located either within, or otherwise associated with, the DUT is used to generate the command, control, and data necessary to test a memory array within the DUT. In testing architectures, such as the one illustrated in FIG. 2, the testing equipment is typically required to generate relatively minimal control information to the DUT, with which logic located within the DUT may generate command, control, and data necessary to test the memory array within the DUT. The control information supplied by the tester, in this case, is minimal and therefore may be input to the DUT via a serial interface, which requires fewer pins to be allocated for testing purposes than the parallel inputs illustrated in FIG. 1. The serial data may then be converted within the DUT to parallel data required by the command, control, and data generation logic.

In the prior art example illustrated in FIG. 2, extensive logic, may be necessary to generate the necessary command, control, and data information to test the memory array of the DUT, as the logic must substantially replace the APG logic of the testing equipment. Because the logic is located within the DUT, however, the memory array may be tested under conditions substantially similar to those of normal operating conditions, thereby improving DUT testing coverage.

Figure 3:
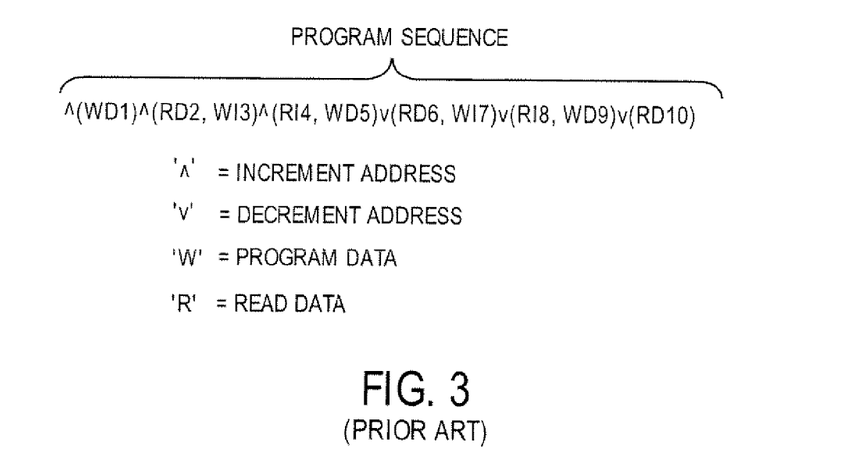
FIG. 3 illustrates an algorithm string generated by a prior art memory testing array architecture.

The command, control, and data generation logic illustrated within FIG. 2 typically requires large sequences of programming information to test the memory within the DUT. For example, one common testing sequence programs and reads data within the memory array at substantially incremental addresses. FIG. 3 illustrates a programming sequence that may be used to configure the prior art command, control, and data generation logic of FIG. 2 to perform a test pattern in which data is programmed to and read from incremental addresses within a memory array within the DUT.

The program sequence of FIG. 3 illustrates six operations (^(wD1), ^(rD2, wI3), ^(rI4, wD5), v(rD6, wI7), v(rI8, wD9), v(rD10)), that must be successfully programmed into the prior art command, control, and data generation logic of FIG. 2 before the command, control, and data generation logic will begin to issue the program sequence to the memory array to be tested. In the program sequence of FIG. 3, the command registers of the prior art are programmed to write an initial data to various memory locations, where "W" represents a write operation, "D" represents an initial data to be written, and "1" represents the operation number (number "1" in this case). Next (operation "2"), the data written from the previous operation ("D") is read ("r"), and erased by writing the inverse value ("I"), and the address is incremented ("^"). Operations 2 and 3 can then be repeated for all address locations being tested.

Once the programming sequence of FIG. 3 is programmed into the registers of the command, control, and data generation logic of FIG. 2, they may be sequentially issued to the memory array to be tested within the DUT via the flow control logic illustrated in FIG. 2.

Requiring lengthy programming sequences to configure the command, control, and data generation logic of the prior art can require extensive logic, programming registers, and overhead, requiring substantial processor real estate and power. On the other hand, the prior art alternative illustrated in FIG. 1, wherein tester equipment is used to generate command, control, and data necessary to test the memory array within the DUT does not typically allow the memory array to be tested at speeds consistent with those of normal operating conditions.

BRIEF DESCRIPTION OF THE DRAWINGS

Embodiments of the invention are illustrated by way of example and not limitation in the figures of the accompanying drawings, in which like references indicate similar elements and in which.

DETAILED DESCRIPTION

Embodiments of the invention relate to memory array testing. More particularly, embodiments of the invention relate to a memory array testing architecture in which a memory array within a device under test (DUT) is able to be tested at speeds substantially similar to those under typical operating conditions of the memory array without incurring significant die real estate and power penalties. Even more specifically, embodiments of the invention involve, among other things, using substantially scalar command, control, and data generation logic to issue testing modules to a memory array without having to program or otherwise configure with the command, control, and data generation logic with an entire test program sequence.

Figure 4:
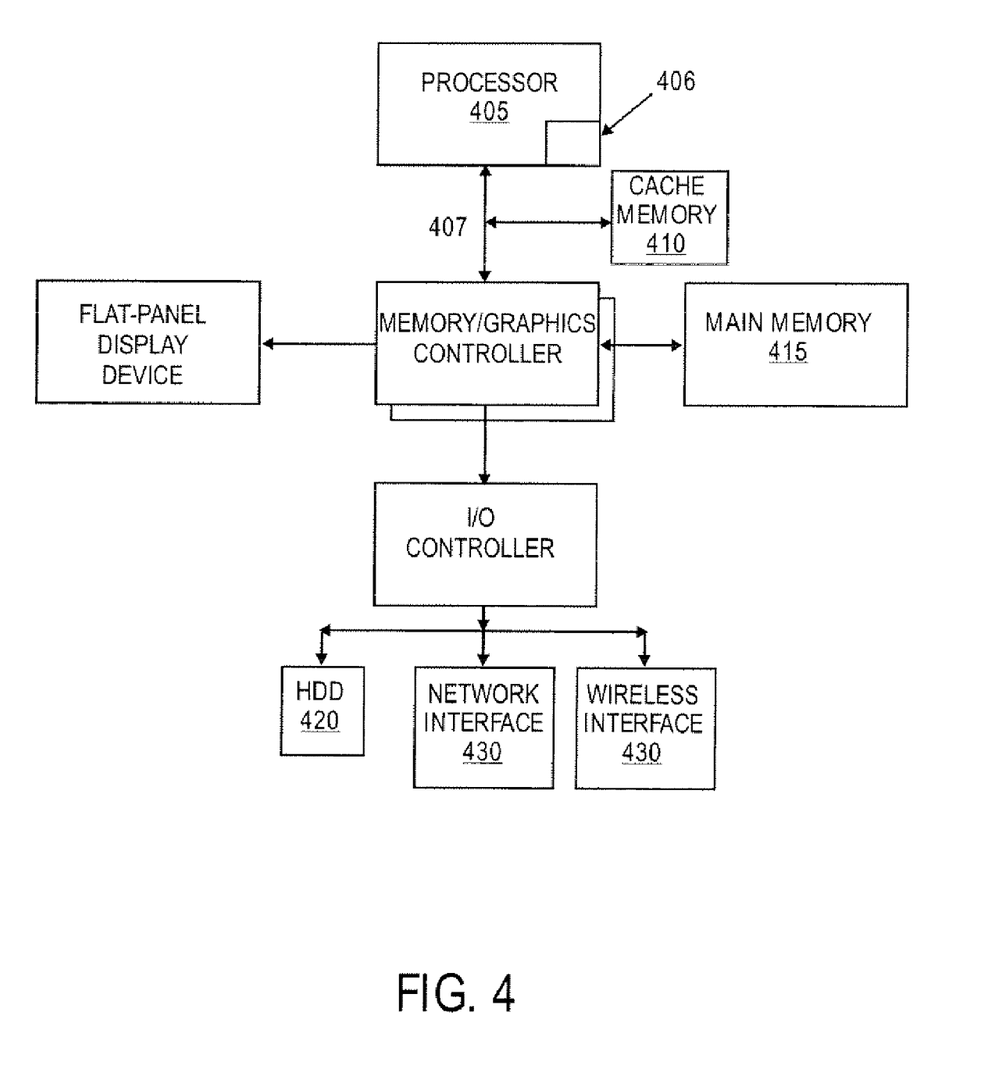
FIG. 4 illustrates a computer system in which at least one embodiment of the invention may be used.

FIG. 4 illustrates a computer system in which at least one embodiment of the invention may be used. A processor 405 accesses data from a level one (L1) cache memory 410 and main memory 415. In other embodiments of the invention, the cache memory may be a level two (L2) cache or other memory within a computer system memory hierarchy. Furthermore, in some embodiments, the cache memory may be located on the same die as the processor. Illustrated within the processor of FIG. 4 is one embodiment of the invention 406. Other embodiments of the invention, however, may be implemented within other devices within the system, such as a separate bus agent, or distributed throughout the system in hardware, software, or some combination thereof.

The main system memory may be implemented in various memory sources, such as dynamic random-access memory (DRAM), a hard disk drive (HDD) 420, or a memory source located remotely from the computer system via network interface 430 containing various storage devices and technologies. The cache memory may be located either within the processor or in close proximity to the processor, such as on the processor's local bus 407. Furthermore, the cache memory may contain relatively fast memory cells, such as a six-transistor (6T) cell, or other memory cell of approximately equal or faster access speed.

Figure 5:
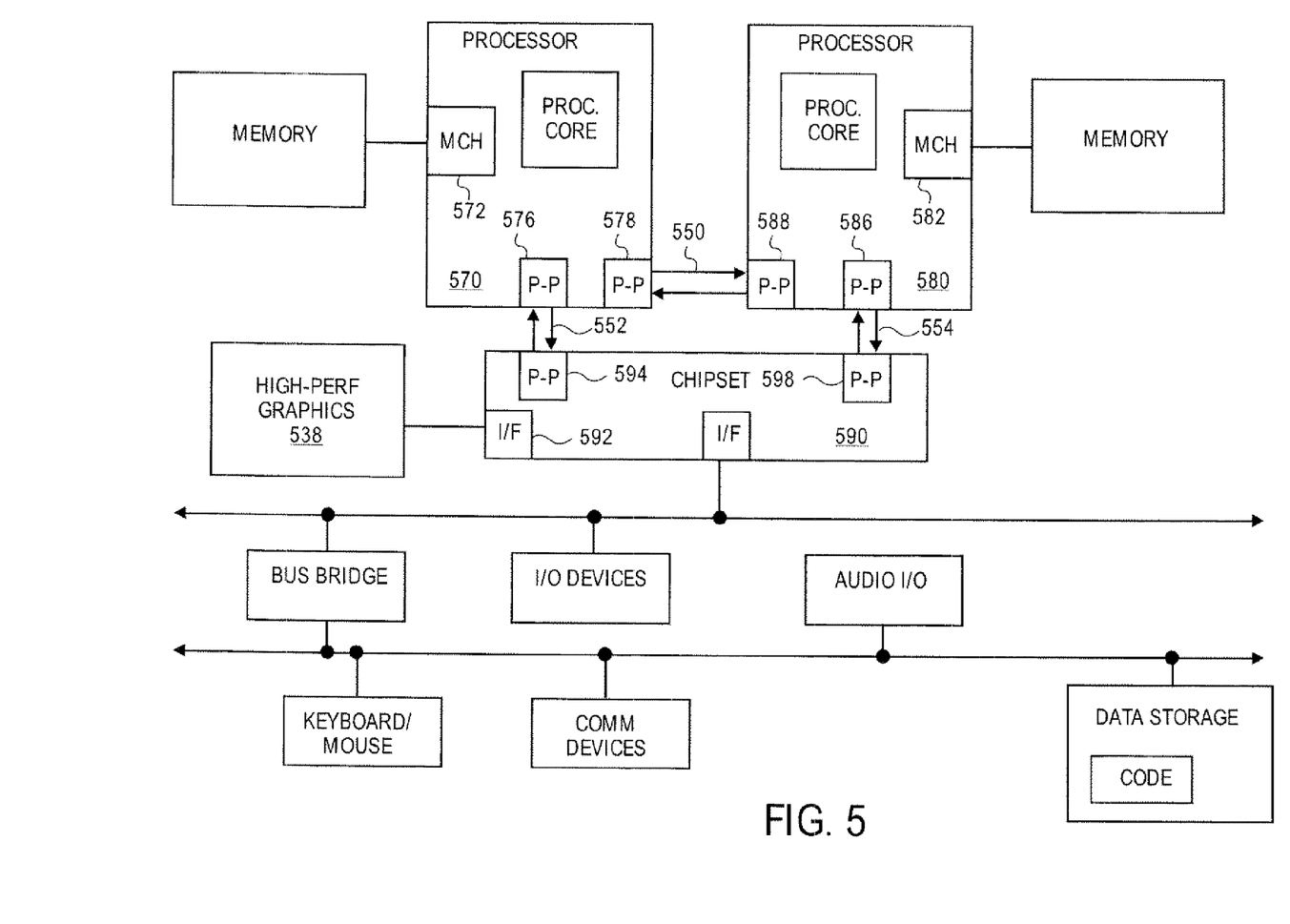
FIG. 5 illustrates a point-to-point (PtP) network of electronic elements within a computer system in which at least one embodiment of the invention may be used.

FIG. 5 illustrates a computer system that is arranged in a point-to-point (PtP) configuration. In particular, FIG. 5 shows a system where processors, memory, and input/output devices are interconnected by a number of point-to-point interfaces.

The FIG. 5 system may also include several processors, of which only two, processors 570, 580 are shown for clarity. Processors 570, 580 may each include a local memory controller hub (MCH) 572, 582 to connect with memory 52, 54. Processors 570, 580 may exchange data via a point-to-point interface 550 using point-to-point interface circuits 578, 588. Processors 570, 580 may each exchange data with a chipset 590 via individual point-to-point interfaces 552, 554 using point to point interface circuits 576, 594, 586, 598. Chipset 590 may also exchange data with a high-performance graphics circuit 538 via a high-performance graphics interface 592.

At least one embodiment of the invention may be located within the memory controller hub 572 or 582 of the processors. Other embodiments of the invention, however, may exist in other circuits, logic units, or devices within the system of FIG. 5. Furthermore, other embodiments of the invention may be distributed throughout several circuits, logic units, or devices illustrated in FIG. 5.

Figure 6:
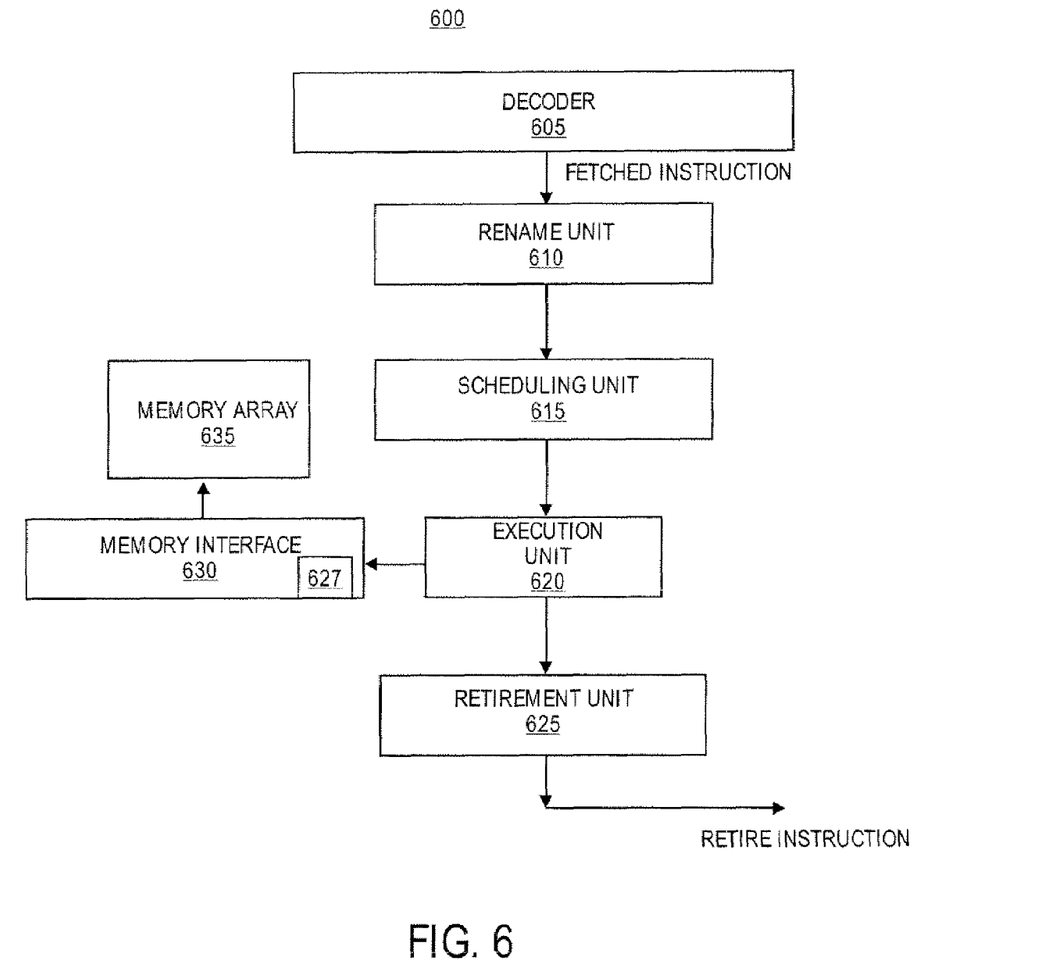
FIG. 6 illustrates a processor containing a memory array, which one embodiment of the invention may be used to test.

FIG. 6 illustrates an electronics element in which some embodiments of the invention may be used. Particularly, FIG. 6 illustrates a processor 600 containing a decoder 605 to decode instructions, a rename unit 610 to rename registers used by the instructions, a scheduling unit 615 to schedule instructions for execution by the execution unit 620, and a retirement unit 625 to retire the instructions after they're executed. Further illustrated in FIG. 6 is a memory interface unit 630 that translates commands, control, and/or data to/from the memory array 635 to/from a functional unit, such as the execution unit, requesting or writing data from/to the memory array. Various embodiments of the invention 627 may be located within the memory interface unit.

Figure 7:
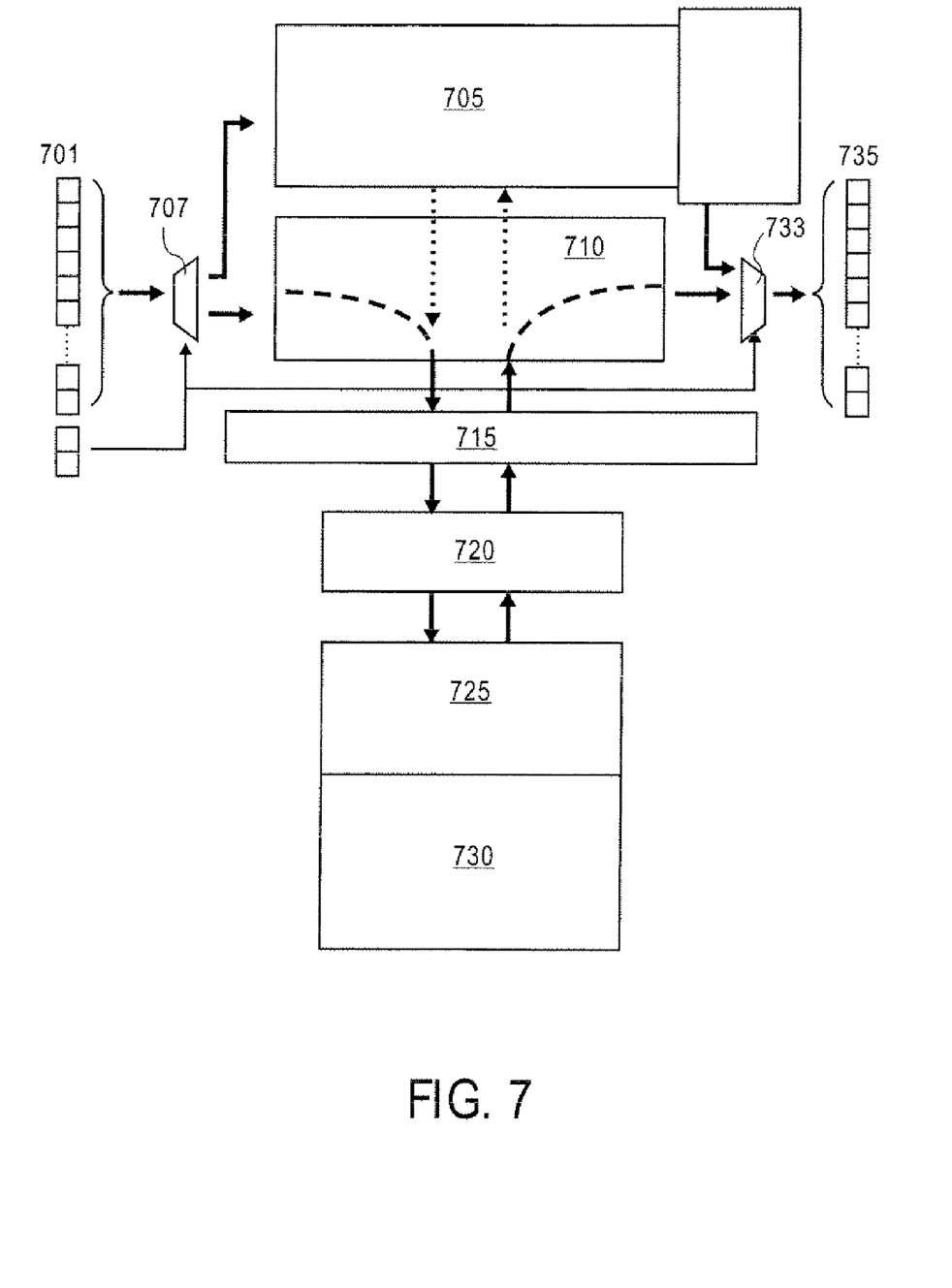
FIG. 7 is a block diagram illustrating logical elements arranged in an architecture commensurate with at least one embodiment of the invention.

FIG. 7 illustrates a memory array testing architecture according to one embodiment of the invention. Input signals may be fed into the architecture via the parallel inputs 701. Alternatively, data may be fed into the architecture serially, as in one prior art architecture, and converted into parallel data before being used to program the command, control, and data generation logic 705. In some embodiments, a prior art command, control, and data generation logic 710 may be included and a mux 707 may be used to select the logic to generate the commands, control, and/or data to test the memory array 730.

Furthermore, in some embodiments, commands, control, and data may be transmitted to the memory array across the host device's internal bus 720 via an internal bus interface 715, which may require that particular protocol rules be followed by the transmitting circuitry. The memory array may also require that signals presented to it via the internal bus be formatted to match a particular interfacing scheme associated with the memory array via memory array interface logic 725. Signals to be read out of the memory array may be presented to the outputs 735 either in their native form (i.e. A format provided by the memory array interface logic) or in some alternative form, such a compressed form, by passing the memory array signals through the compare logic 740. Furthermore, the signals to be provided to the outputs may be selected from the prior art command, control, and/or data generation logic or from the logic associated with various embodiments of the invention via a mux 733, using signals from the inputs as selection signals.

Figure 8:
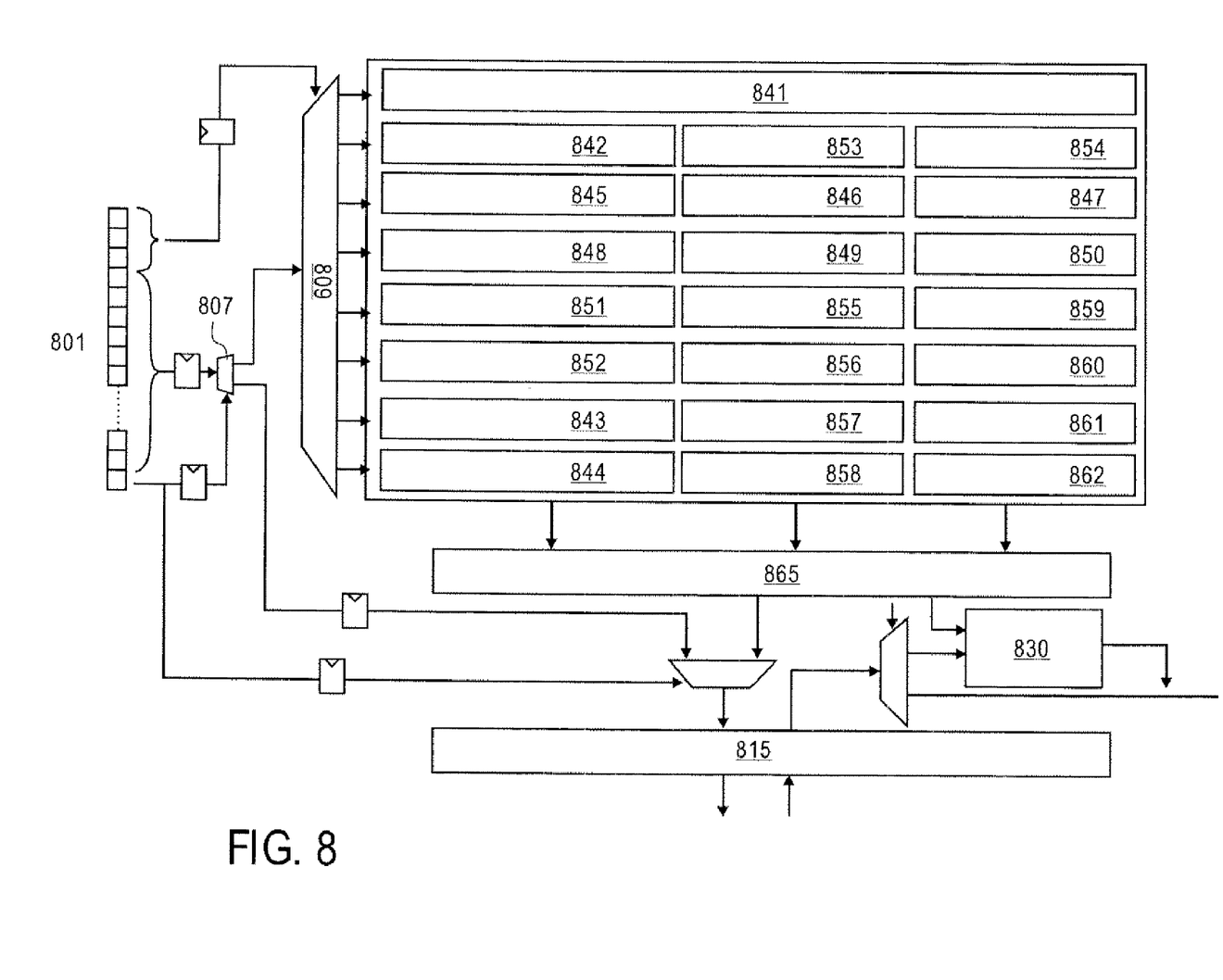
FIG. 8 illustrates logic that may be programmed to perform various aspects of at least one embodiment of the invention.

FIG. 8 illustrates logical elements that may be included in a memory array testing architecture according to one embodiment of the invention. Particularly, FIG. 8 illustrates a command, control, and data generation unit containing various functional units to perform functions in response to being programmed by signals presented to the input 801.

After the command, control, and data generation unit has been selected, via the mux 807, a row of registers is selected for programming via the register programming mux 809. In at least one embodiment of the invention, the register programming mux selects one among the eight register rows in order for the registers within that row to be programmed in parallel with the data presented to the inputs.

In one embodiment, the registers within command, control, and data generation unit include command registers, counters, control registers, address and address control registers, mask registers, and compare registers. In other embodiments, other registers may be used and/or grouped in various alternative arrangements. The embodiment illustrated in FIG. 8, includes an array_data_in/compare_data register 841 to store data to be written to the array to be tested and to store the compare data with which data read from the array will be compared.

The embodiment of FIG. 8 also includes a mask register 842, data background control register 843 and address sequence register 844, which may all be programmed in parallel if the row to which they correspond is selected via the register programming mux. The mask register is to store a mask with which to select or mask bits read from the array and to be compared by the compare logic 830. The data background control register is used to store control information that will cause various data patterns to be programmed into the memory array to be tested. The address sequence control register stores control information to select one of several address sequences within the memory array to be tested.

The embodiment of FIG. 8 also includes a max x-address register 845, a max y-address register 846, and an outer counter register 847, which may all be programmed in parallel if the row to which they correspond is selected via the register programming mux. The max x-coordinate is to store the maximum x-coordinate address of the memory array to be tested, whereas the max y-coordinate address is to store the maximum y-coordinate address of the memory array to be tested. The outer counter register is to store a count of how many programming modules are to be executed by the command, control, and data generation logic.

The embodiment of FIG. 8 also includes base address 848, a fast address 849, and a latency register 850, all of which may be programmed in parallel if the row to which they correspond is selected via the register programming mux. The base address register stores a reference address from which various array programming algorithms may begin to program the array. The fast address register stores addresses within a bank of the memory array to be tested, such that once a bank is selected (by a corresponding slow address, for example), addresses within the bank may be programmed or read relatively quickly. The latency register stores a delay value to generate a delay from a time in which data is read from the memory array to be tested to when the data is decoded or otherwise interpreted. This may be useful if the data is to be compared to an expected value before being returned to a user or program.

The embodiment illustrated in FIG. 8 includes at least four sets of command 851-854, inner counter 855-858, and address control 859-862 registers, any set of which may be programmed in parallel if the row to which they correspond is selected via the register programming mux. The command registers store various access commands, according to the testing programming language used, to perform functions such as, array programming ("write"), array data detection ("read"), etc.

Figures 9, 10:
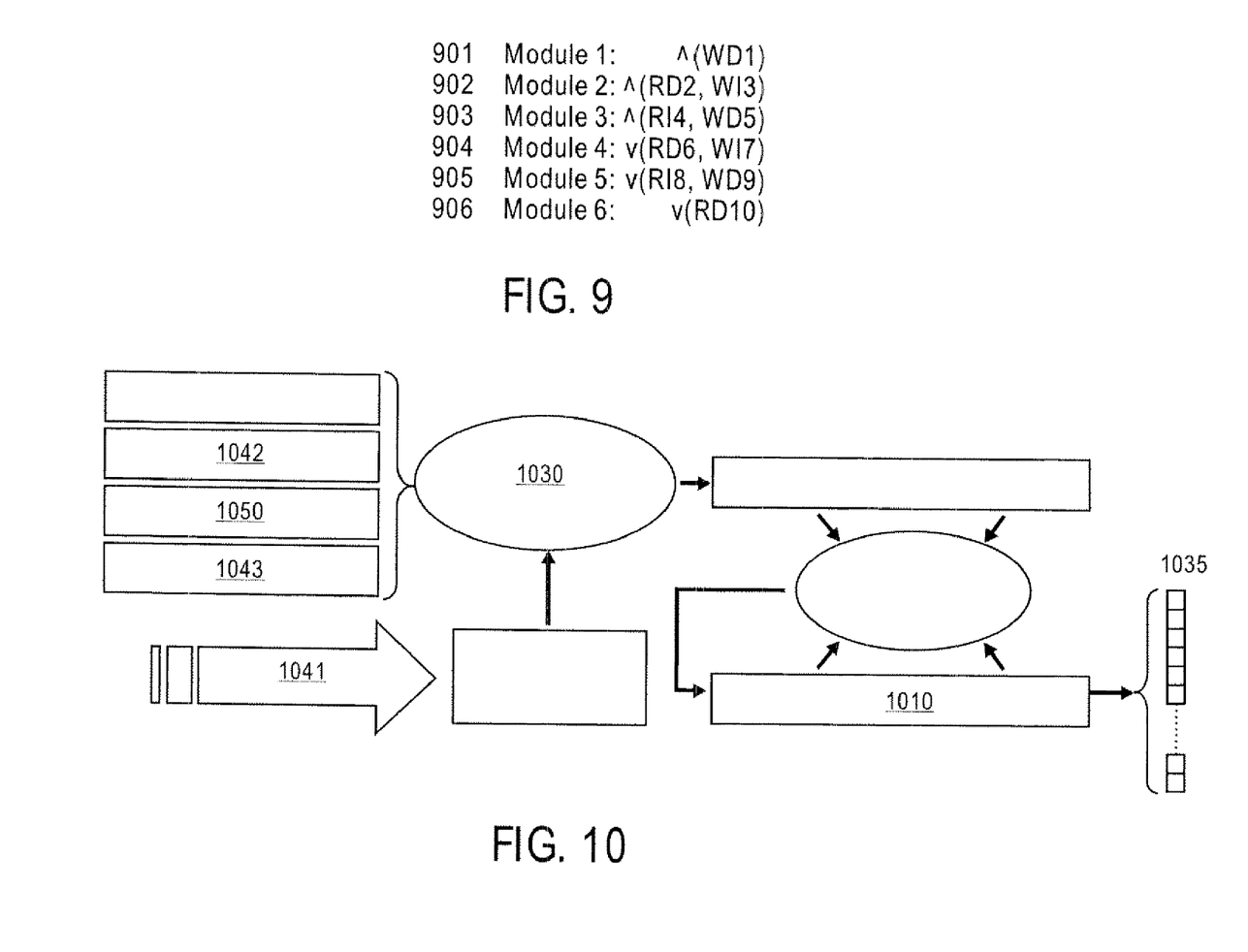
FIG. 9 illustrates a series of algorithm modules that may be used to program at least one embodiment of the invention to test a memory array within, or otherwise associated with, the DUT.
FIG. 10 illustrates a rasterizing technique according to one embodiment of the invention.

For example, FIG. 9 illustrates a sequence of programming modules that may be issued to the command, control, and data generation logic according to one embodiment of the invention. Each module 901 through 906 is presented on the inputs and programmed into the command, control, and data generation logic sequentially or in various combinations. Furthermore, the command, control, and data generation logic can issue each module to the memory array being tested before receiving subsequent modules.

Advantageously, the ability of the command, control, and data generation logic to execute individual or groups of modules rather than only an entire program sequence, as in the prior art, allows logic designers to trade parallel execution of modules for improvements in power consumption and die real estate savings. For example, in an application in which die real estate and/or power is at a premium, each module of FIG. 9 may be separately programmed into command, control, and data generation logic and the logic may then issue each module to the memory array before the subsequent module has been received by the logic.

In the above example, the number of command and corresponding inner counter and address control registers illustrated in FIG. 8 may be reduced in applications in which die real estate and/or power is at a premium. Conversely, the number of command registers and corresponding inner counter and address control registers may be increased in order to facilitate execution of multiple program modules in parallel in applications in which power and die real estate are not as much of a concern.

In one embodiment of the invention, a command from each of the command registers may be transmitted to the array to be tested from the internal bus interface 815 in consecutive internal bus cycles. The inner counter registers store a number of times the corresponding command register is to be accessed consecutively. This register is useful if a programming module contains information to cause commands to be issued from the same command register consecutively. The address control registers store address direction information associated with a command stored in the command register to which it corresponds.

In other embodiments of the invention, the particular register organization and functional descriptions may be different. Furthermore, some of the registers described may be consolidated into fewer registers.

For each access of the memory array by the command, control, and data generation logic, flow control logic 865 ensures that the accesses are issued to and data retrieved from the memory array in proper sequence. In some embodiments of the invention, data read from the memory array under test may be compared against an expected value using the compare logic. The compare logic may also be used to reduce the traffic of data that is delivered to the outputs 835 by only allowing bits to be sent to the outputs that correspond to a particular compare state, such as a bit match or a bit mis-match. This is a technique known as "rastering". However, in other embodiments, each bit of the corresponding array data read from the array may be delivered to the outputs.

FIG. 10 illustrates a rastering technique using compare logic 1030 according to one embodiment of the invention. The rasterization scheme of FIG. 10 makes use of several of the fields stored in various registers discussed above in reference to FIG. 8. For example, for a given address sequence 1044 of a particular data background pattern 1043, the corresponding array read data 1041 is accessed from the memory and delivered to the compare logic after a latency delay 1050, where a Boolean "AND" operation is performed between the array read data and the mask value 1042. This result is then compared against the previously written data.

Embodiments of the invention may generate various resolutions of compare results by representing a set of matched or mismatched bits by a single or sub-set of bits. For example, in the embodiment illustrated in FIG. 10, a set of bits ("chunk") within the array read data that do not match the mask value can be represented by one bit indicating a "chunk fail". Alternatively, if every bit within a set of array read data mismatches with every bit within the mask value, this may be represented by a bit or group of bits to indicate an "all fail" condition.

Reducing the resolution of compare result bits can be beneficial in some applications in which, for example, there are not enough outputs 1035 to represent a mis-match in each bit of the array read data. However, embodiments of the invention, in which there are not enough outputs to represent the comparison result of each bit of the array read data within one clock cycle, may use buffers 1010 to store the comparison results until they can be clocked out to the outputs.

Embodiments of the invention described herein may be implemented with circuits using complementary metal-oxide-semiconductor devices, or "hardware", or using a set of instructions stored in a medium that when executed by a machine, such as a processor, perform operations associated with embodiments of the invention, or "software". Alternatively, embodiments of the invention may be implemented using a combination of hardware and software.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. An apparatus comprising:
a memory array;
first testing logic to test a portion of the memory array, wherein the first testing logic is able to issue a first testing operation programmed into the first testing logic to the memory array before receipt of a subsequent testing operation in the first testing logic that has a dependency upon the first testing operation, the first testing logic including a plurality of sets of registers, each set including a command register to store access commands and an inner counter register to store a number of times the command register is to be accessed consecutively to enable the first testing logic to issue the same access command consecutively, wherein the first testing operation and the subsequent testing operation each correspond to a programming module of a sequence of programming modules;
second testing logic to test the portion of the memory array;
a multiplexer to select the first testing logic or the second testing logic to issue testing operations to the memory array;
the first testing logic further including an outer counter register to store a count of how many programming modules are in the sequence of programming modules to be executed by the first testing logic.

2. The apparatus of claim 1 further comprising a plurality of inputs trough which the first and subsequent operations are to be transmitted to the first testing logic in parallel, wherein at least some of the plurality of inputs are to control the multiplexer.

3. The apparatus of claim 2 wherein the first testing logic comprises at least a first and second set of registers that may be programmed in parallel with information corresponding to the first and subsequent testing operations, respectively.

4. The apparatus of claim 3 wherein the information comprises a command chosen from a group consisting of a read command and a write command.

5. The apparatus of claim 4 wherein the memory array is coupled to the first testing logic via an internal bus interface.

6. The apparatus of claim 5 further comprising flow control logic to cause the information to be issued to the memory array in a proper sequence.

7. The apparatus of claim 6 further comprising comparison logic to compare a plurality of bits read from the memory array with a plurality of bits stored within a mask of a mask register of the first testing logic, wherein the comparison logic is to select or mask the plurality of bits read from the array for comparison based on the mask.

8. The apparatus of claim 7 wherein the comparison logic includes rasterizing logic to represent a plurality of non-matching bits with a fewer number of bits than the plurality of non-matching bits within the plurality of bits that are not equal to a corresponding plurality of bits within the mask.

9. A processor comprising:
first testing logic to test a memory array according to a sequence of programming modules, wherein each programming module of the sequence is to be programmed into the first testing logic and issued to the memory array before a subsequent programming module is received in the first testing logic, the first testing logic including a plurality of sets of registers, each set including a command register to store access commands and an inner counter register to store a number of times the command register is to be accessed consecutively to enable the first testing logic to issue the same access command consecutively, and an outer counter register to store a count of the sequence of programming modules to be executed by the first testing logic;
second testing logic to test the memory array;
a multiplexer to select the first testing logic or the second testing logic to issue testing operations to the memory array;
a plurality of outputs to receive test results from the testing logic;
comparison logic to compare memory array bits read from the memory array with bits from a mask register,
rasterizing logic to represent a plurality of non-matching bits within the memory array bits that do not match the bits from the mask register with a number of bits that is less than the non-matching memory array bits.

10. The processor of claim 9 wherein the comparison logic receives latency information to delay the comparison.

11. The processor of claim 9 wherein the non-matching bits are represented by a single bit to be driven to one of the plurality of outputs.

12. The processor of claim 11 wherein the plurality of non-matching bits comprises fewer bits than all of the array read bits.

13. The processor of claim 11 wherein the plurality of non-matching bits comprises all of the array read bits.

14. The processor of claim 9 further comprising buffers to store a plurality of bits to represent a plurality of non-matching bits from the comparison if the plurality of bits to represent the plurality of non-matching bits is greater than the plurality of outputs.

15. The processor of claim 9 further comprising a plurality of inputs to receive testing information in parallel.

16. The processor of claim 9 wherein the first testing logic is able to issue a first testing operation to the memory array before a second testing operation that depends on the first testing operation is received by the first testing logic.

17. The processor of claim 16 wherein the memory array is within a level-one cache memory.

18. A system comprising:
a memory array;
a processor having first testing logic to test a portion of the memory array, wherein the first testing logic is able to issue a first testing operation programmed into the first testing logic to the memory array before receiving a subsequent testing operation that has a dependency upon the first testing operation, the first testing logic including a plurality of sets of registers, each set including a command register to store access commands and an inner counter register to store a number of times the command register is to be accessed consecutively to enable the first testing logic to issue the same access command consecutively, wherein the first testing operation and the subsequent testing operation each correspond to a programming module of a sequence of programming modules, and an outer counter register to store a count of how many programming modules are in the sequence of programming modules to be executed by the first testing logic, second testing logic to test the portion of the memory array, and a multiplexer to select the first testing logic or the second testing logic to issue testing operations to the memory array.

19. The system of claim 18 wherein the first testing operation is to write a first data to a first address location within the memory array.

20. The system of claim 19 wherein the subsequent testing operation is to read the first data from the first address location and write the inverse of the first data to the first address location and increment to a second address location.

21. The system of claim 20 wherein first and subsequent testing operations are part of a more extensive programming sequence of testing operations in which an earlier testing operation writes data to an address that a later testing operation is to read and erase.

22. The system of claim 21 wherein the first and subsequent testing operations operate on data words of 32 bits.

23. The system of claim 22 further comprising comparison logic to detect which bits of the first data do not match a corresponding number of bits within a bit mask.

24. The system of claim 23 wherein a plurality of output bits representing non-matching bits within the first data are to be received by outputs of the processor.

25. The system of claim 18 further comprising testing equipment to issue a plurality of testing modules to the processor.

26. The system of claim 25 wherein the testing modules comprise the first and subsequent testing operation.

* * * * *